United States Patent
Kosaka et al.

(10) Patent No.: US 11,515,208 B2
(45) Date of Patent: Nov. 29, 2022

(54) SEMICONDUCTOR DEVICE AND SEMICONDUCTOR APPARATUS

(71) Applicant: SUMITOMO ELECTRIC DEVICE INNOVATIONS, INC., Kanagawa (JP)

(72) Inventors: Toshiyuki Kosaka, Yokohama (JP); Shunsuke Kurachi, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 108 days.

(21) Appl. No.: 17/178,158

(22) Filed: Feb. 17, 2021

(65) Prior Publication Data

US 2021/0193520 A1 Jun. 24, 2021

Related U.S. Application Data

(63) Continuation of application No. 16/277,856, filed on Feb. 15, 2019, now Pat. No. 10,957,591.

(30) Foreign Application Priority Data

Feb. 16, 2018 (JP) .............................. JP2018-025680

(51) Int. Cl.
 *H01L 23/00* (2006.01)
 *H01L 21/768* (2006.01)
 (Continued)

(52) U.S. Cl.
 CPC ...... *H01L 21/76898* (2013.01); *H01L 21/288* (2013.01); *H01L 21/2855* (2013.01); *H01L 24/80* (2013.01)

(58) Field of Classification Search
 CPC .............................................. H01L 23/49513
 See application file for complete search history.

(56) References Cited

U.S. PATENT DOCUMENTS 6,268,619 B1 7/2001 Kosaka
8,563,433 B2 10/2013 Kosaka
(Continued)

FOREIGN PATENT DOCUMENTS

JP H03-088371 9/1991
JP H07-176760 7/1994
(Continued)

OTHER PUBLICATIONS

Srirattana, Nuttapong, et al., Analysis and Design of a High-Efficiency Multistage Doherty Power Amplifier for Wireless Communication, *IEEE Transactions on Microwave Theory & Techniques*, vol. 53, No. 3, Mar. 2005.

*Primary Examiner* — Moazzam Hossain
(74) *Attorney, Agent, or Firm* — Smith, Gambrell & Russell, LLP.

(57) ABSTRACT

A semiconductor device that comprises a substrate with a primary surface and a secondary surface opposite to the primary surface. The primary surface provides a semiconductor active device. The semiconductor device includes a base metal layer deposited on the secondary surface and within the substrate via in which a vacancy is formed, and an additional metal layer on the base metal layer, the additional metal layer having different wettability against a solder as compared to the base metal layer whereby the solder is contactable by the base metal layer and repelled by the additional metal layer. The semiconductor device is die-bonded on the assembly substrate by interposing the solder between the secondary surface and the assembly substrate. The base metal layer in a portion that excepts the substrate via and a periphery of the substrate via by partly removing the additional metal layer is in contact with the solder.

6 Claims, 5 Drawing Sheets

(51) Int. Cl.
*H01L 21/285* (2006.01)
*H01L 21/288* (2006.01)

(56) References Cited

U.S. PATENT DOCUMENTS

| | | | |
|---|---|---|---|
| 2001/0028113 | A1 | 10/2001 | Kosaka |
| 2007/0125411 | A1* | 6/2007 | Yasutake ................. H01L 35/32 |
| | | | 136/200 |
| 2008/0131983 | A1* | 6/2008 | Lin .......................... H01L 24/05 |
| | | | 438/18 |
| 2009/0001478 | A1 | 1/2009 | Okamoto |
| 2011/0081784 | A1 | 4/2011 | Kosaka |
| 2011/0241074 | A1 | 10/2011 | Okamoto |
| 2014/0264868 | A1* | 9/2014 | Radulescu ........ H01L 21/32139 |
| | | | 438/622 |
| 2015/0121692 | A1* | 5/2015 | Eifuku .................... H01L 24/81 |
| | | | 29/840 |
| 2018/0240765 | A1 | 8/2018 | Emori |

FOREIGN PATENT DOCUMENTS

| | | |
|---|---|---|
| JP | H10-303198 | 11/1998 |
| JP | 2003-007708 | 1/2003 |
| JP | 2003-045965 | 2/2003 |
| JP | 2009-033097 | 2/2009 |
| JP | 2010-003796 | 1/2010 |
| JP | 2010-229429 | 10/2010 |
| JP | 2011-077434 | 4/2011 |
| JP | 2015-035495 | 2/2015 |

\* cited by examiner

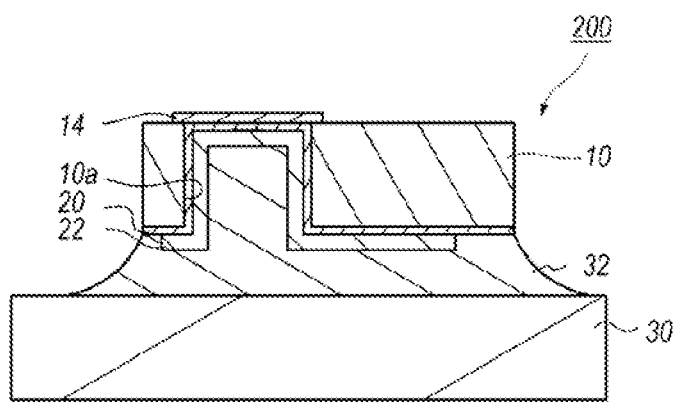
Fig. 5 *(prior art)*

SEMICONDUCTOR DEVICE AND SEMICONDUCTOR APPARATUS

CROSS REFERENCE TO RELATED APPLICATIONS

The present application is a continuation of U.S. application Ser. No. 16/277,856 which claims priority benefit of Japanese Patent Application, JP2018-025680 filed on Feb. 16, 2018, the disclosure of which is hereby incorporated by reference in its entirety.

BACKGROUND OF INVENTION

1. Field of Invention

The present invention relates to a process of forming a semiconductor device and a semiconductor apparatus.

2. Related Background

A semiconductor device is usually die-bonded on an assembly substrate using a solder, in particular, eutectic solder such as gold tin (AuSn). A Japanese Patent Application laid open No. JP2015-035495A has discloses a process for forming the back metal. Also, a substrate via that pierces the substrate is a common technique to stabilize the ground potential connected to a source pad connected to a source electrode of a semiconductor device type of field effect transistor (FET). The substrate via directly connects the source electrode to the ground in the back surface of the substrate.

However, die-bonding the substrate providing the substrate via mounts onto the assembly substrate with solder, the solder invades into the substrate via and solidifies there. Such solder iterates shrinkage and expansion according to variation of ambient temperatures, which results in de-attaching the semiconductor device from the assembly substrate, or weakens the die-bond strength against the assembly substrate.

SUMMARY OF INVENTION

An aspect of the present invention relates to a process of forming a semiconductor device that comprises a substrate with a primary surface and a secondary surface opposite to the primary surface. The primary surface provides a semiconductor active device. The semiconductor device further comprises a base metal layer deposited on the secondary surface and within the substrate via, and an additional metal layer on the base metal layer, the additional metal layer having different wettability against a solder as compared to the base metal layer whereby the solder is contactable by the base metal layer and repelled by the additional metal layer. The semiconductor device is die-bonded on the assembly substrate by interposing the solder between the secondary surface of the substrate and the assembly substrate. The base metal layer in a portion that excepts the substrate via and a periphery of the substrate via by partly removing the additional metal layer is in contact with the solder. There is a vacancy in the substrate via.

BRIEF DESCRIPTION OF THE DRAWINGS

For a better understanding of the embodiments, reference will now be made by way of example only to the accompanying figures in which:

FIG. 5 is a cross sectional view of a conventional semiconductor device.

DESCRIPTION OF EMBODIMENT

Next, some embodiments according to the present invention will be described referring to drawings. In the description of the drawings, numerals or symbols same with or similar to each other will refer to elements same with or similar to each other without duplicating explanations.

First Embodiment

Figure 1A:
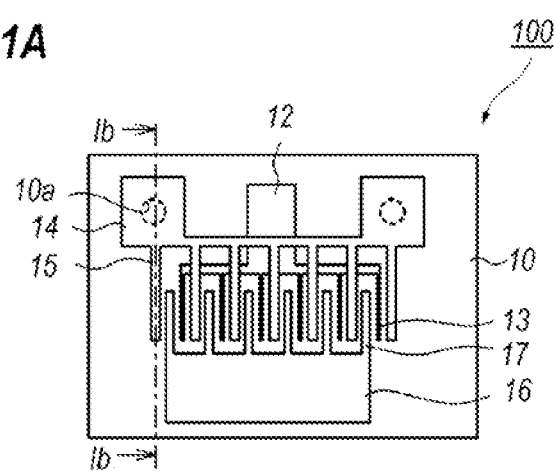
FIG. 1A is a plan view of a semiconductor device according to the embodiment.

FIG. 1A is a plan view showing a semiconductor device 100 according to the first embodiment of the present invention. The semiconductor device 100 is a type of field effect transistor (FET) providing a substrate 10, a gate pad 12, gate fingers 13, source pads 14, source fingers 15, a drain pad 16, and drain fingers 17. The substrate 10, which is an insulating substrate, may be made of silicon carbide (SiC), sapphire ($Al_2O_3$), and so on. Formed within the substrate 10 are a channel layer made of gallium nitride (GaN), a barrier layer made of aluminum gallium nitride (AlGaN), and so on, where the channel layer and the barrier layer form a two-dimensional electrode gas (2DEG) at an interface therebetween, exactly, in the channel layer next to the interface between the channel layer and the barrier layer. The channel layer may be operable as a channel for the electron transportation.

The substrate 10 provides the pads, 12, 14, and 16, and the fingers, 13, 15, and 17, in a primary surface thereof. The fingers of the gate 13, the source 15, and the drain 17 extend from the respective pads, 12, 14, and 16. One gate finger 13 is put between one source finger 15 and one drain finger 17 to form one transistor element; and several elements constitute the FET 100. The fingers of the source 15 and the drain 17 are formed by allowing stacked metals of titanium (Ti) and aluminum (Al), while, the pads of the source 14 and the drain 16 primarily includes gold (Au) layer. The Au layer also covers the fingers of the source 14 and the drain 16. The gate pad 12 and the gate finger 13 include stacked metals of nickel (Ni), palladium (Pd), and gold (Au).

Figure 1B:
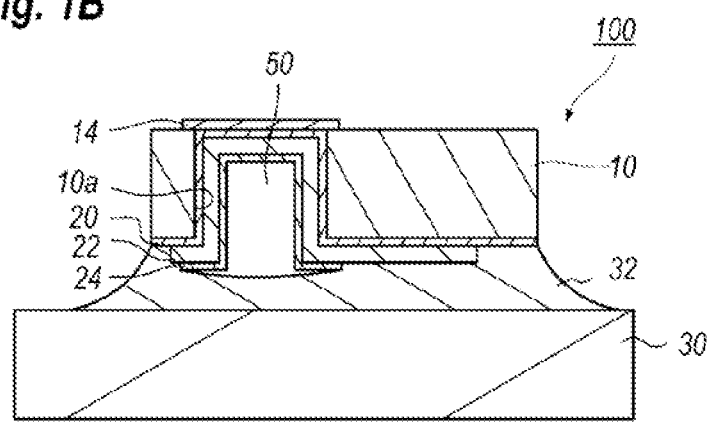
FIG. 1B is a cross sectional view of a semiconductor apparatus which includes a cross sectional view of the semiconductor device taken along the line IB-IB indicated in FIG. 1A.

FIG. 1B is a cross sectional view of a semiconductor apparatus which includes a cross sectional view of the semiconductor device 100 taken along the line Ib-Ib indicated in FIG. 1A. As shown in FIG. 1A and FIG. 1B, the substrate 10 also provides a substrate via 10a piercing from the secondary surface to the primary surface thereof. The source pad 14 in the primary surface overlaps with the substrate via 10a. As shown in FIG. 1B, the secondary surface of the substrate 10 provides a first metal layer 20 and a second metal layer 22, where the second metal layer 22 is formed by plating. The first metal layer 20 and the second metal layer 22 are an aspect of the base metal layer of the present invention. The first metal layer 20, which covers the secondary surface of the substrate 10 and sides of the substrate via 10a, comes in contact with the source pad 14 in the primary surface of the substrate 10. The second metal layer 22, which partially covers the first metal layer 20 around the substrate via 10a, may stabilize the ground potential, that is, the second metal layer 22 provides the ground (GND) in the semiconductor active device in the primary surface. The second metal layer 22 may be formed by electrolytic plating using the first metal layer 20 as a seed metal. The second metal layer 22 is partially covered with the third metal layer 24 within and around the substrate via 10a, where the third metal layer 24 prevents solder 32 from invading within the substrate via 10a. The third metal layer 24 is an aspect of the additional metal layer of the present invention. Accordingly, the substrate via 10a leaves a vacancy 50 therein.

The first metal layer 20 stacks, from a side in contact with the secondary surface of the substrate 10, an alloy of nickel (Ni) and chromium (Cr), which is often called as nichrome (NiCr) with a thickness of 50 to 200 nm, and a gold (Au) with a thickness of 50 to 200 nm; or a stacked metals of Ti and Au each having thicknesses substantially same with those described. The second metal layer 22 may be made of gold (Au). The third metal layer 24 contains at least Ni, typically also made of nichrome (NiCr). Surfaces of the first metal layer 20 and the second metal layer 22 have wettability against the solder 32 compared with the third metal layer 24. The second metal layer 22 has a thickness of 5 to 10 μm, while the third metal layer 24 has a thickness of 20 to 200 nm.

As shown in FIG. 1B, the semiconductor device 100 is mounted on an assembly substrate 30 using the solder 32 that may be a resin containing fine powders of eutectic solder such as gold tin (AuSn), silver (Ag), and so on. The solder 32 is in contact with the first and second metal layers, 20 and 22, but repelled by the third metal layer 24 to leave the vacancy in the substrate via 10a.

Second Embodiment

Figure 2A:
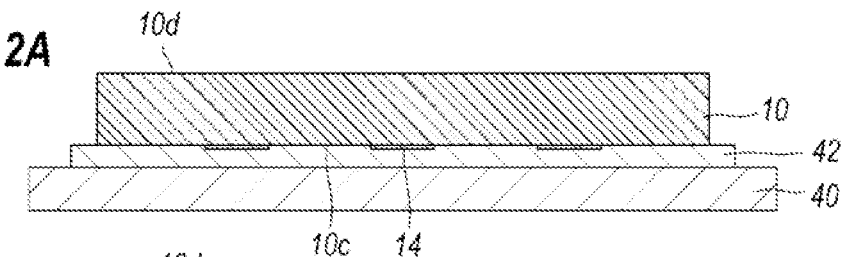
FIG. 2A to FIG. 2F are cross sectional views of the semiconductor device shown in FIG. 1B at respective steps of a process of forming the semiconductor device.
Figure 2B:
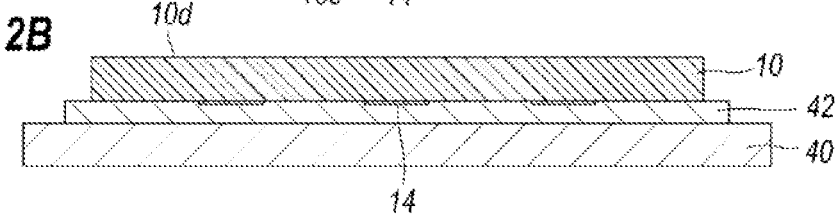
Figure 2C:
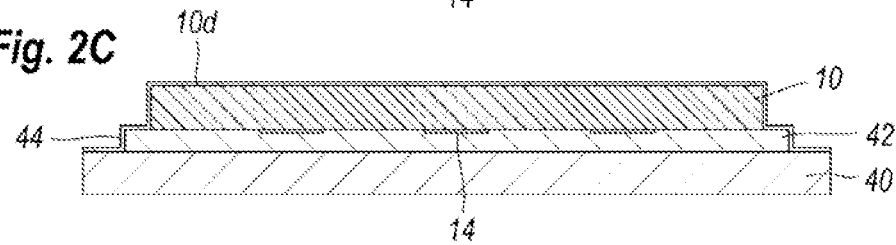

FIG. 2A to FIG. 4F are cross sectional views of the semiconductor device 100 at respective steps of a process of forming the device 100. As shown in FIG. 2A, the process first forms the pads of the gate 12, the source 14, and the drain 16 in the primary surface 10c of the substrate 10, where FIG. 2A omits the pads of the gate 12 and the drain 16. Also, the process forms the fingers of the gate 13, the source 15, and the drain 17 in the primary surface 10c of the substrate 10. Thereafter, the substrate 10 is attached to a support substrate 40 by, for instance, wax 42 such that the primary surface 10c thereof faces and attaches to the support substrate 40. Then, as shown in FIG. 2B, the process grinds the secondary surface 10d of the substrate 10 to a thickness around 100 μm. Then, a physical deposition technique, typically, sputtering may form stacked metal layer 44 of NiCr and gold on the secondary surface 10d of the substrate 10 and a surface of the support substrate 40 including a surface of the wax 42 and an edge of the substrate 10 and that of the was 42.

Figure 2D:
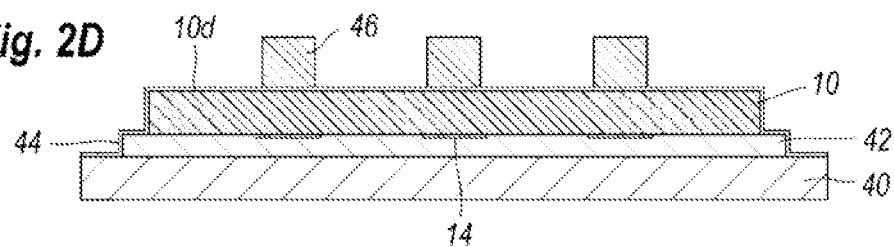
Figure 2E:
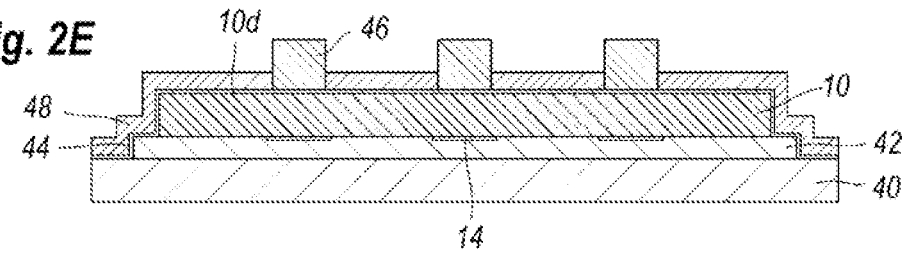
Figure 2F:
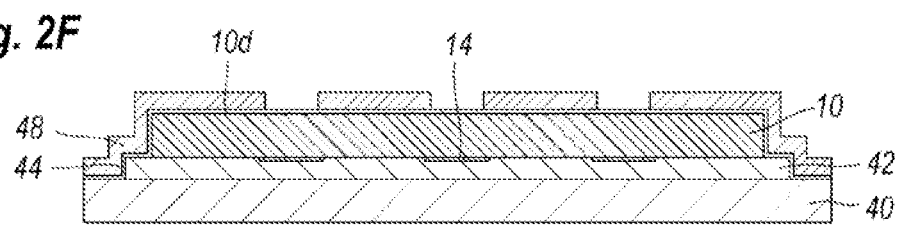

Thereafter, a patterned photoresist 46 is formed on the metal layer 44, as shown in FIG. 2D, where the patterned photoresist 46 provides islands in portions overlapping with the source pad 14. That is, the patterned photoresist 46 covers the portions of the metal layer 44 corresponding to the source pad 14. Selective electrolytic plating gold (Au) using the metal layer 44 as a seed layer, as shown in FIG. 2E, and removing the patterned photoresist 46, a metal mask 48 made of Au is left on the metal layer 44, as shown in FIG. 2F. Removing the metal layer 44 exposed in openings of the metal mask 48, the metal mask 48 may be left on the substrate 10 so as to expose the secondary surface 10d of the substrate 10 in the portion corresponding to the source pad 14.

Figure 3A:
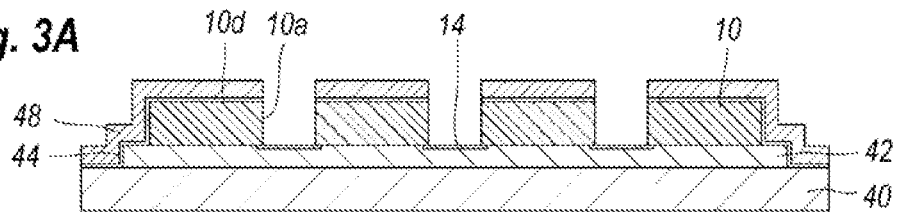
FIG. 3A to FIG. 3F are cross sectional views of the semiconductor device shown in FIG. 1B at respective steps of a process subsequent to the shown in FIG. 2F.
Figure 3B:
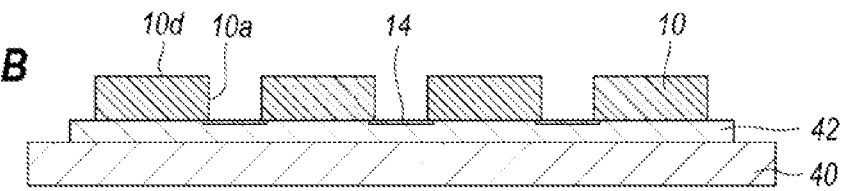
Figure 3C:
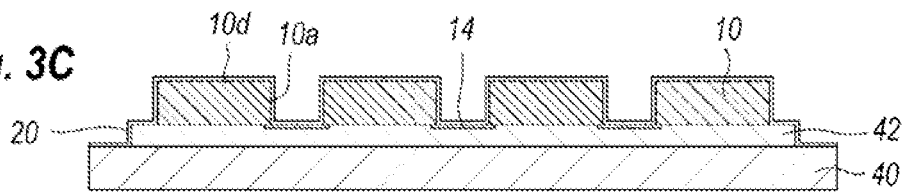

Next, as shown in FIG. 3A, the etching using the metal mask 48 removes a portion of the metal layer 44 and the substrate 10 overlapping with the source pad 14, which forms a substrate via 10a with a width that may be determined by an aspect ratio of 0.5 to 10 against a thickness of the substrate 10 after grinding thereof. In the present embodiment, the grinding may thin the substrate 10 to a thickness around 100 μm, exactly, 100±10 μm, which means that the substrate via 10a has the width around 50 to 10 μm. After the formation of the substrate via 10a, the process removes the metal mask 48 and the metal layer 44, which is shown in FIG. 3B. Thereafter, the second sputtering forms another metal layer 20, which is refereed as the first metal layer, continuously on a whole secondary surface 10d of the substrate 10, the whole surface of the support substrate 40, inner walls of the substrate via 10a, and on the surface of the source pad 14, where the first metal layer 20 may be stacked metals of NiCr and Au each having thicknesses around 50 to 200 nm, as shown in FIG. 3C.

Figure 3D:
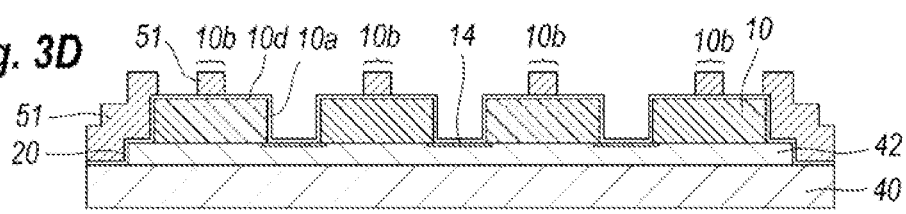
Figure 3E:
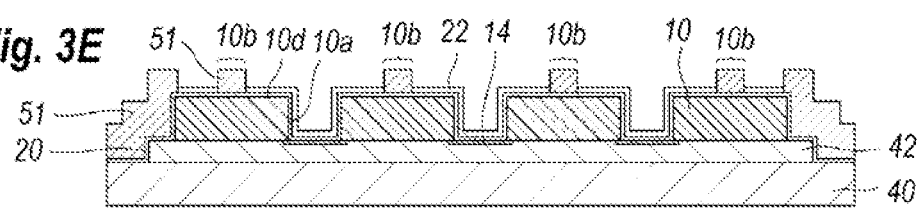
Figure 3F:
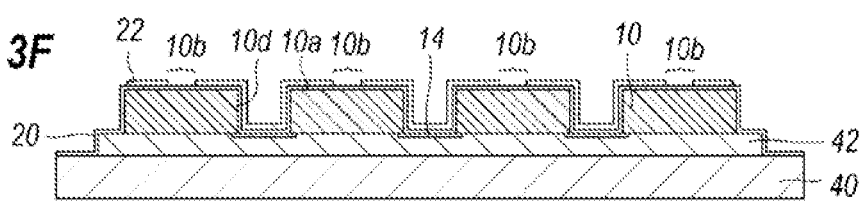

Thereafter, another patterned photoresist 51 partially covers the surface of the metal layer 20, shown in FIG. 3D. Specifically, the patterned photoresist 51 may cover the periphery of the substrate 10 and regions 10b corresponding to scribe lines. Selective electrolytic plating carried out subsequent to the formation of the patterned photoresist 51 forms a thickened Au layer 22 only in regions on the metal layer 20 exposed from the photoresist 51, as shown in FIG. 3E. The Au layer 22 will be referred as the second metal layer 22. Removal of the photoresist 51 may selectively leave the plated Au layer 22 so as to partially expose the metal layer 20, as shown in FIG. 3F.

Figure 4A:
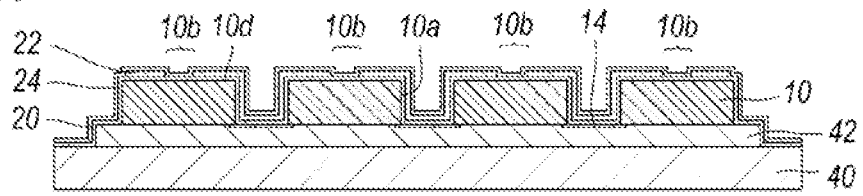
FIG. 4A to FIG. 4F are cross sectional views of the semiconductor device shown in FIG. 1B at respective steps of a process subsequent to the shown in FIG. 3F.
Figure 4B:
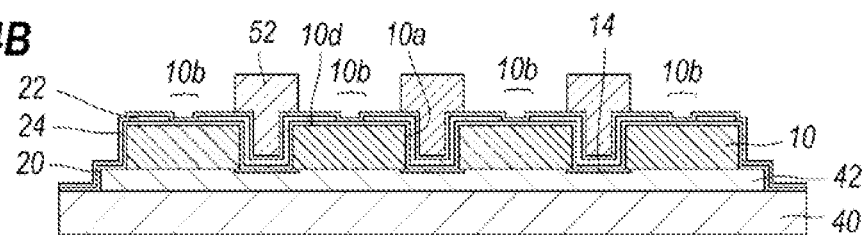
Figure 4C:
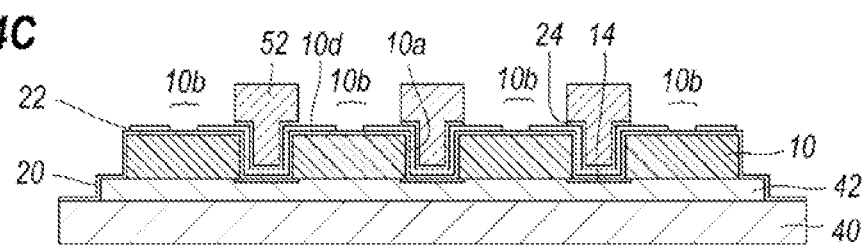

Thereafter, as shown in FIG. 4A, the third sputtering stacks another NiCr layer 24 on the first metal layer 20 and the second metal layer 22 with a thickness around 40 nm. The NiCr layer 24, which will be referred as the third metal layer, covers the surface of the support substrate 40, the surface of the substrate 10 including the inner wall of the substrate via 10a, and the surface of the source pad 14. Also, the third metal layer 24 covers the first metal layer 20 in the regions 10b corresponding to the scribe lines. Thereafter, still another patterned photoresist 52 covers the substrate via 10a and the third metal layer 24 around the substrate via 10a, as shown in FIG. 4B. A solution containing iodine (I) may selectively remove the third metal layer 24 on the second metal layer 22 exposed from the patterned photoresist 52. The regions 10b are unnecessary to leave the first metal layer 20 because the regions 10b are prepared for the scribe lines. However, the present embodiment provides the Au layer in the top of the first metal layer 20; accordingly, the NiCr layer under the Au layer in the first metal layer 20 is left un-etched by the solution above mentioned. The first metal layer 20 left in the regions 10b may enhance the die-bond strength of the substrate 10 against the solder 32. Moreover, the third metal layer 24 is left inside of the substrate via 10a and the periphery of the substrate via 10a with a width around 10 μm.

In an alternative for an application where the scribe line is not preferable to leave a Au layer, in particular, in the top thereof, the Au layer in the top of the first metal layer 20 in the regions 10b for the scribe lines may be removed by a wet-etching after the removal of the third metal layer 24. The removal of the top Au layer in the first metal layer 20 also etches the second metal layer 22. However, the latter layer 22 has a thickness far greater than that of the former Au layer 20 in the top thereof. Accordingly, the removal of the Au layer may expose the NiCr layer of the first metal layer 20 in the regions 10b for the scribe lines. In still another alternative where the regions 10b leave no metals, a second etching using a solution containing iodine (I) after the removal of the Au top layer in the regions 10b may remove the NiCr layer in the first metal layer 20 and expose the substrate 10 in the regions 10b.

The embodiment concentrates on an arrangement where the metal layers, 20 and 24, include NiCr layers; however, the invention may applicable to following metals and solutions for those metals; that is, a solution of hydrochloric acid (HCl) substituting a solution containing iodine (I) may solve NiCr, while, the Au layers, 24 and 20, are stable for HCl. When the first metal layer 20 provides stacked metals of NiCr and copper (Cu), where Cu is provided in the top thereof, while, the third metal layer 24 is NiCr; a ferric chloride ($FeCl_3$) may solve both NiCr and Cu; but the Au layers, 24 and 20, are still stable for $FeCl_3$. Also, the third metal layer 24 may include titanium (Ti). When the first metal layer 20 has stacked metals of NiCr/Cu, while, the third metal layer 24 is Ti, or the former layer has stacked metals of NiCr/Au, while the third metal layer 24 is Ti; Ti in the third metal layer 24 may be selectively removed by an ion-milling using argon ions (Art), or a dry-etching using a reactive gas containing fluorine (F). The first metal layer 20 may be formed, except for the sputtering, by a sequential process of vacuum evaporation and subsequent lift-off technique.

Figure 4D:
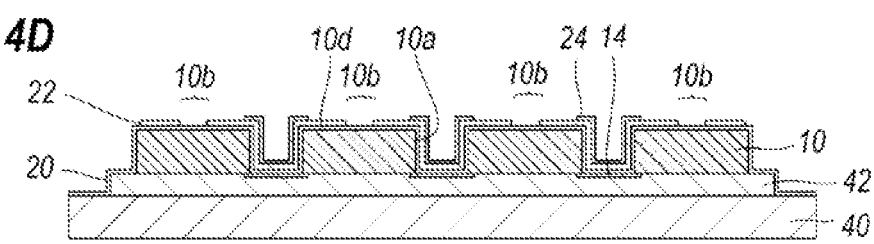
Figure 4E:
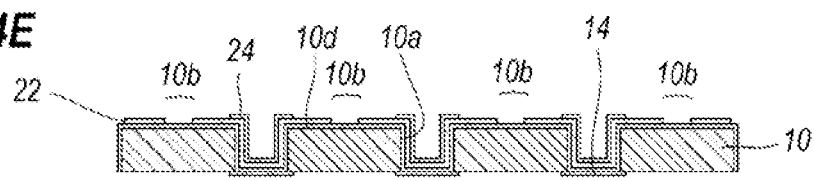
Figure 4F:
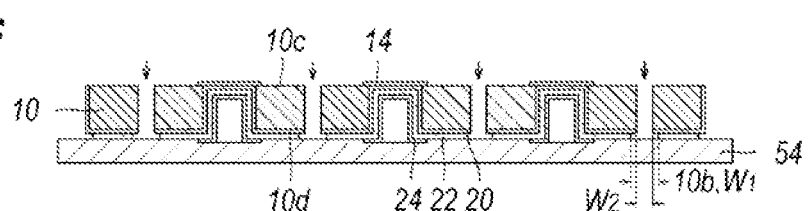

The process thereafter removes the patterned photoresist 52 as shown in FIG. 4D, and de-attaches the substrate 10 from the support substrate 40 by heating the support substrate 40 to a temperature 100 to 200° C. to melt the wax 42. Thereafter, an organic solvent may remove the wax 42, FIG. 4E. Attaching an expanding tape 54 to the back surface 10d of the substrate 10, the process may carry out the dicing from the top surface 10c thereof, as shown in FIG. 4F, to divide the substrate 10 into respective semiconductor chips in respective regions 10b indicated by arrows in FIG. 4F. Because the regions 10b each have a width W1 greater than a width W2 of a dicing blade, which is substantially equal to a width of the cuts; the metal layer 20 may be left in peripheries of individual semiconductor chips even after the dicing. That is, the back surface 10d of the substrate 10 exposes the first metal layer 20, the second metal layer 22, and the third metal layer 24 from the peripheries to a center thereof. Referring to FIG. 1B, attaching the secondary surface of the semiconductor device 100 to a melted solder 32, such as gold tin (AuSn); the solder 32 spreads on the first metal layer 20 and the second metal layer 22 but prevents from spreading within the substrate via 10a and the around the substrate via 10a with a width around 10 µm because the substrate via 10a and the peripheries thereof are covered with the third metal layer of NiCr that shows lessor wettability against the solder 32. Solidifying the solder 32, the semiconductor device 100 may be mounted on the assembly substrate 30 without the solder 32 from penetrating within the substrate via 10a to leave the vacancy therein.

FIG. 5 is a cross sectional view of a conventional semiconductor device 200 die-bonded on the assembly substrate 30. The conventional semiconductor device 200 does not provide the third metal layer 24, and formed by a process without the steps shown in FIG. 4A to FIG. 4C. That is, the conventional semiconductor device 200 does not provide the third metal layer 24 within the substrate via 10a and the periphery thereof. The solder 32 may spread on the second metal layer 22 having good wettability against the solder 32 and finally fills the substrate via 10a. The solder 32 invading into the substrate via 10a iterates shrinkage and expansion according to a variation of ambient temperatures, and occasionally causes cracks within the substrate via 10a. The third metal layer 24, which has lesser wettability against the solder 32, within the substrate via 10a and the peripheries thereof according to the present invention may effectively prevent the solder 32 from invading into the substrate via 10a, which may effectively suppress degradation of the die-bond strength of the semiconductor device 100 against the assembly substrate 30.

The first metal layer 20 preferably has etching selectivity against the third metal layer 24 in order to securely leave the first metal layer 20 during the removal of the third metal layer 24 in the regions 10b. For instance, the first metal layer 20 has the Au layer in the top thereof, while, the third metal layer 24 has NiCr, and the etchant for the third metal layer 24 is HCl. Such an arrangement may show an enough selectivity of etching the metal layer 24 against the metal layer 20.

Referring to FIG. 1B, the substrate 10 provides the substrate via 10a that is covered with, from the inside to the surface of the substrate 10, the first metal layer 20, the second metal layer 22, and the third metal layer 24. The third metal layer 24 has lessor wettability against the solder 32 compared with the first metal layer 20 and the second metal layer 22, the solder 32 may be effectively prevented from invading within the substrate via 10a. The invading solder 32 within the substrate via 10a occasionally causes cracks because of shrinkage and expansion according to variations of the ambient temperatures. The embodiment of the present invention may effectively prevent the solder 32 from invading into the substrate via 10a.

The first metal layer 20, the second metal layer 22, and the third metal layer 24 are sequentially formed on the source pad 14, the side of the substrate via 10a, and the back surface 10d of the substrate 10 in the periphery of the substrate via 10a. The third metal layer 24 prevents the solder 32 from invading into the substrate via 10a, which enhances the die-bond strength of the semiconductor device 100 onto the assembly substrate 30 by the solder 32.

The first metal layer 20 is left in the periphery in the back surface of the semiconductor chip after the dicing thereof. Accordingly, the solder 32 may spread in the periphery of the semiconductor chip, which may enhance the die-bond strength of the semiconductor chip onto the assembly substrate 30. The first metal layer 20 include Au in the top thereof, while, the third metal layer 24 includes Ni or Ti. Such arrangements of the first and third metal layers, 20 and 24, may show the etching selectivity of the third metal layer 24 against the first metal layer 20.

The first metal layer 20 in the top thereof and the second metal layer 22 preferably has materials same with each other. For instance, the top of the first metal layer 20 and the second metal layer 22 may be Au that shows good wettability against the solder 32. The top of the first metal layer 20 may be Au, while, the third metal layer 24 may be NiCr. The top of the first metal layer 20 and the second metal layer 22 may be copper (Cu). The third metal layer 24 may be Ti.

The substrate 10 in the semiconductor device 100 includes a semiconductor active device type of the FET primarily made of nitride semiconductor materials that are semiconductor materials containing nitrogen (N), for instance, gallium nitride (GaN), aluminum gallium nitride (AlGaN), indium gallium nitride (InGaN), indium nitride (InN), and/or aluminum indium gallium nitride (AlInGaN). The substrate 10 may be, except for nitride semiconductor materials, a semiconductor material containing arsenide (As) such as gallium arsenide (GaAs). The semiconductor device in the semiconductor layer may be except for an FET. The substrate 10 may be silicon carbide (SiC), silicon (Si), sapphire ($Al_2O_3$), and so on.

While several embodiments and variations of the present invention are described in detail herein, it should be apparent for ordinary artisans that the disclosure and teachings of the present invention will suggest many alternative designs to those skilled in the art.

What is claimed is:

1. A semiconductor device, comprising:
a substrate with a primary surface and a secondary surface opposite to the primary surface, the primary surface providing a semiconductor active device thereon, the substrate having a substrate via that pierces from the secondary surface to the semiconductor active device on the primary surface;
a base metal layer deposited on the secondary surface and within the substrate via; and
an additional metal layer on the base metal layer, the additional metal layer having different wettability against a solder as compared to the base metal layer whereby the solder is contactable by the base metal layer and repelled by the additional metal layer;
wherein the semiconductor device is die-bonded on an assembly substrate by interposing the solder between the secondary surface of the substrate and the assembly substrate,
wherein the base metal layer in a portion that excepts the substrate via and a periphery of the substrate via by partly removing the additional metal layer is in contact with the solder, and
wherein there is a vacancy in the substrate via.

2. The semiconductor device according to claim 1, wherein the base metal layer sequentially includes an alloy of nickel and chromium (NiCr) and a gold (Au) layer each having thicknesses of 50 to 200 nm.

3. The semiconductor device according to claim 1, wherein the additional metal layer is an alloy of Ni and Cr with a thickness of 20 to 200 nm.

4. The semiconductor device according to claim 1, wherein the additional metal layer is deposited in the periphery of the substrate via with a width at least 10 μm.

5. The semiconductor device according to claim 1, wherein the base metal layer is an Au layer deposited with a thickness of 5 to 10 μm.

6. A semiconductor apparatus, comprising:
a semiconductor device and an assembly substrate,
wherein the semiconductor device comprises:
a substrate with a primary surface and a secondary surface opposite to the primary surface, the primary surface providing a semiconductor active device thereon, the substrate having a substrate via that pierces from the secondary surface to the semiconductor active device on the primary surface;
a base metal layer deposited on the secondary surface and within the substrate via; and
an additional metal layer on the base metal layer, the additional metal layer having different wettability against a solder as compared to the base metal layer whereby the solder is contactable by the base metal layer and repelled by the additional metal layer;
wherein the semiconductor device is die-bonded on the assembly substrate by interposing the solder between the secondary surface of the substrate and the assembly substrate,
wherein the base metal layer in a portion that excepts the substrate via and a periphery of the substrate via by partly removing the additional metal layer is in contact with the solder, and
wherein there is a vacancy in the substrate via.

* * * * *